United States Patent [19]

Ahmed

[11] Patent Number: 4,890,068
[45] Date of Patent: Dec. 26, 1989

[54] OPEN-LOOP CURRENT AMPLIFIERS HAVING IMPROVED GAIN CHARACTERISTICS

[75] Inventor: Syed M. Ahmed, Flemington, N.J.

[73] Assignee: Siemens Aktiengesellschaft, Berlin and Munich, Fed. Rep. of Germany

[21] Appl. No.: 283,674

[22] Filed: Dec. 13, 1988

[51] Int. Cl.[4] ............................................... H03F 3/45
[52] U.S. Cl. .................................................... 330/253
[58] Field of Search .......................... 330/253, 295, 310

[56] References Cited

PUBLICATIONS

Tsividis et al, "A Process Insensitive NMOS Operational Amplifier", Digest of Technical Papers, 1979 IEEE International Solid-State Circuits Conference, Feb. 15, 1979, pp. 188–189.
Article by David C. Soo et al.: IEEE Journal of Solid-State Circuits, vol. SC-17, No. 6, Dec. 1982; pp. 1174–1178.
Article by Barrie Gilbert; IEEE Journal of Solid-State Circuits, vol. SC-3, No. 4, Dec. 1968; pp. 353–365.

Primary Examiner—James B. Mullins
Attorney, Agent, or Firm—John Francis Moran

[57] ABSTRACT

An amplifier includes a first pair of FETS arranged in a differential amplifier configuration having their drain-source paths connected between a first constant current source and a point of operating potential. A second pair of FETS has gate electrodes coupled together for receiving an input signal, source electrodes coupled together to a second constant current source, and drain electrodes connected to sources of third and fourth FETS, respectively. The gate electrodes of the fourth FET and the first FET in the first pair are connected to the sources of the third and fourth FETS, respectively, the latter connection forming an output junction. A third pair of FETS has gate electrodes coupled together for receiving the input signal, source electrodes coupled together to the source electrodes of the second pair to form another differential amplifier configuration, and drain electrodes coupled to the source electrodes of fifth and sixth FETs, respectively. The sixth FET has its source electrode coupled to the gate electrode of the second FET in the first pair, and its gate electrode coupled to the source electrode of the fifth FET. The drain electrodes of the third, fourth, fifth and sixth FETS are coupled to the point of operating potential. The gate electrodes of the third and fifth FETS are coupled to a point of reference potential. Upon receipt of the input signal, the amplifier provides a high gain output signal at the output junction.

20 Claims, 5 Drawing Sheets 4,890,068

OPEN-LOOP CURRENT AMPLIFIERS HAVING IMPROVED GAIN CHARACTERISTICS

BACKGROUND OF THE INVENTION

This invention relates to current amplifiers in general and more particularly to a high-gain current amplifier employing MESFETS or MOSFETS.

As one can ascertain, amplifiers having wide bandwidths in excess of 100 mHz with low amplitude distortion and stable gain have been extremely important in the field of monolithic microwave integrated circuits (MMIC).

The prior art has thoroughly investigated such amplifiers and many examples of typical prior art amplifiers are known. A major breakthrough in such an amplifier configuration was described in an article entitled "A New Wide-Band Amplifier Technique" by Barrie Gilbert published in the *IEEE, Journal of Solid State Circuits,* Vol. SC-3, No. 4, December 1986, pages 353–365. This amplifier is based on two common circuits which were combined to produce the new amplifier configuration. The first circuit is the conventional differential pair which was widely used as a multiplier configuration. The second circuit is a current source which is employed in practically every linear IC. The article describes the combination of such circuits and in FIG. 3 show the new circuit structure. The article gives an extensive analysis of the principles of operation as well as the advantages of using the circuit.

Particularly, if reference is made to Page 363 of the article there is shown a photo-micrograph of an integrated gain-cell amplifier. The description of the amplifier as well as the operating characteristics of the amplifier are given. As indicated, such amplifiers were investigated in the prior art. The increasing use of MOS technology for the implementation of analog functions which incorporate amplifiers lead researchers to the development of various MOS building blocks such as filters, voltage references, operational amplifiers and multipliers. A conventional building block that has long been used in bipolar circuits is the 4-quadrant analog multiplier which employs differential amplifiers. Analog multiplies with performance adequate for microwave signal processing have been described and reported for use in MOS technology.

Reference is made to a paper entitled "A Four-Quadrant NMOS Analog Multiplier" which was published in the *Proceedings of the IEEE, Journal of Solid State Circuits,* Vol. SC-17 No. 6, December 1982 by David C. Soo, et al. This article describes circuitry which implements a 4-quadrant analog multiplier fabricated in NMOS technology. The circuit approach is based on the square law characteristic of the MOS transistor and results in a multiplier with performance approaching bipolar circuits. As can be seen, that article also cites an article by B. Gilbert, the author indicated above, and entitled "The High Performance Monolithic Multiplier Using Active Feedback" which was published in the *IEEE Journal of Solid State Circuits,* Vol. SC-9, pages 364–373, Dec. 1974.

The Soo article shows a differential FET pair which is fabricated from NMOS technology where the differential pair is utilized in cascaded configurations to provide an MOS-quadrant analog current multiplier which is shown in a simplified schematic in FIG. 3, page 1175 of the article.

In spite of the strides made by the prior art there is still required a high-gain amplifier circuit which desirably employs MESFETS or MOSFETS.

The amplifier according to this invention provides improved gain characteristics whereby the amplifier exhibits increased gain due to increased depth of modulation of "inner pair" tail current.

The amplifier is an open-loop amplifier which can be employed in many applications and is especially adapted to be integrated utilizing MMIC techniques.

SUMMARY OF THE INVENTION

An improved wideband amplifier apparatus (FIG. 5) for exhibiting increased gain over a broad bandwidth comprising a first pair of parallel FETS (53, 56) arranged in a differential amplifier configuration having the source electrodes coupled together with the drain electrodes of said first and second FETS in said pair adapted to be coupled to a point of operating potential (VCC), and means (49, 50) coupled to said source electrodes to provide a current return for said first pair, each FET in said first pair having a gate electrode, a second pair of FETS (42, 43) having the gate electrodes coupled together for receiving an input signal and having the source electrodes coupled together, with the first FET (42) in said second pair having a drain electrode coupled to the source electrode of a third FET (52) with the gate electrode of said third FET coupled to a point of reference potential and with the drain electrode of said third FET (52) adapted to be coupled to said point of operating potential, with the drain electrode of said second FET (43) in said second pair coupled to the source electrode of a fourth FET (51) with the source electrode of said third FET (52) coupled to the gate electrode of said fourth FET and with the junction between the drain of said second FET (43) in said second pair as coupled to the source electrode of said fourth FET (51) coupled to the gate electrode of said first FET (53) in said first pair, and providing an output (VOUT 2), a third pair of FETS (46, 47) having the gate electrodes coupled together for receiving said input signal and having the source electrodes coupled together and coupled to the source electrodes of said second pair of FETS (42, 43) to form a differential amplifier configuration therewith and means (44, 45) coupled to said source electrodes of said second and third pairs to provide a current return for said second and third pairs, and with the drain electrodes of said first FET (47) in said third pair coupled to the source electrode of a fifth FET (58) with the gate electrode of said fifth FET (58) coupled to a point of reference potential, and with the drain electrode of said second FET (46) in said third pair coupled to the source electrode of a sixth FET (57) having the gate electrode coupled to the junction between the drain of said first FET (47) of said third pair and the source of said fifth FET (58), with the drain electrodes of said fifth and sixth FETS (57, 58) adapted to be coupled to said point of operating potential and with the junction between the drain electrode of said second FET (46) in said third pair and the source of electrode said sixth FET (57) coupled to the gate electrode of said second FET (56) in said first pair, whereby upon receipt of said input signal, said amplifier provides a high gain output signal at the drain electrode of FET (55, 56) and a secondary output of the drain of said FET 43 of said second pair (VOUT 2).

DETAILED DESCRIPTION OF THE FIGURES

Figure 1:
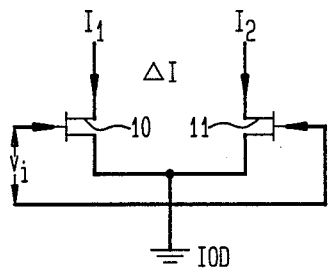
FIG. 1 is a simple schematic diagram showing a prior art differential amplifier configuration.

Referring to FIG. 1, there is shown a prior art configuration of a differential amplifier utilizing MOSFETS or MESFETS.

As indicated, FIG. 1 shows a simple differential pair including FET devices 10 and 11. The FET devices 10 and have their source electrodes connected together with the source-to-drain path of each transistor carrying a respective current. In FIG. 1, FET 10 carries the current $I_1$ while FET carries the current $I_2$. The input signal designated as $V_i$ is applied to the gate electrodes of FETS 10 and 11 as shown in FIG. 1. The combined current which is designated as IDD is directed through the connected source electrodes and is the sum of currents $I_1$ and $I_2$. As one can ascertain, transistors 10 and 11 are N-channel MESFETS or MOSFETS. The same principles and explanations of operation would be applicable to P-channel devices as well.

The simple differential pair 10 and 11 as shown in FIG. 1 has a transfer function or transconductance $\Delta I/V_i$ which is given by the equation:

$$\Delta I = I_1 - I_2 = KV_i \sqrt{\frac{2IDD}{K} - V_i^2} \tag{1}$$

Figure 2:
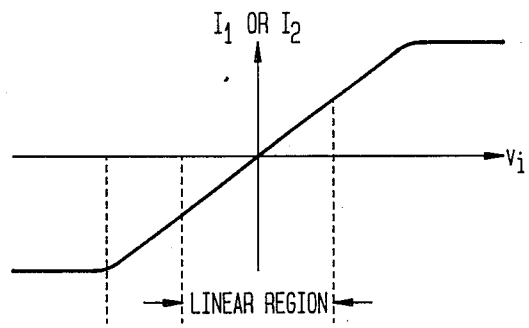
FIG. 2 is a diagram depicting the transfer characteristics of the circuit of FIG. 1.

Assuming a square law device function, the transfer function is plotted in FIG. 2 showing a fairly linear range over approximately 30 percent of full scale operation. For a typical example, this would be about 1 volt peak to peak in a 1.5 volt process such as the unit 1 IDD of full scale. The above transfer function can be linearized to better than 99 percent of full scale if the input voltage $V_i$ is predistored to look like that of FIG. 2, $V_i$. This is explained in the article by Soo, et al. which appeared in *The Journal of Solid State Circuits*, Vol. SC-17 No. 6, December 1982 as above.

Figure 3:
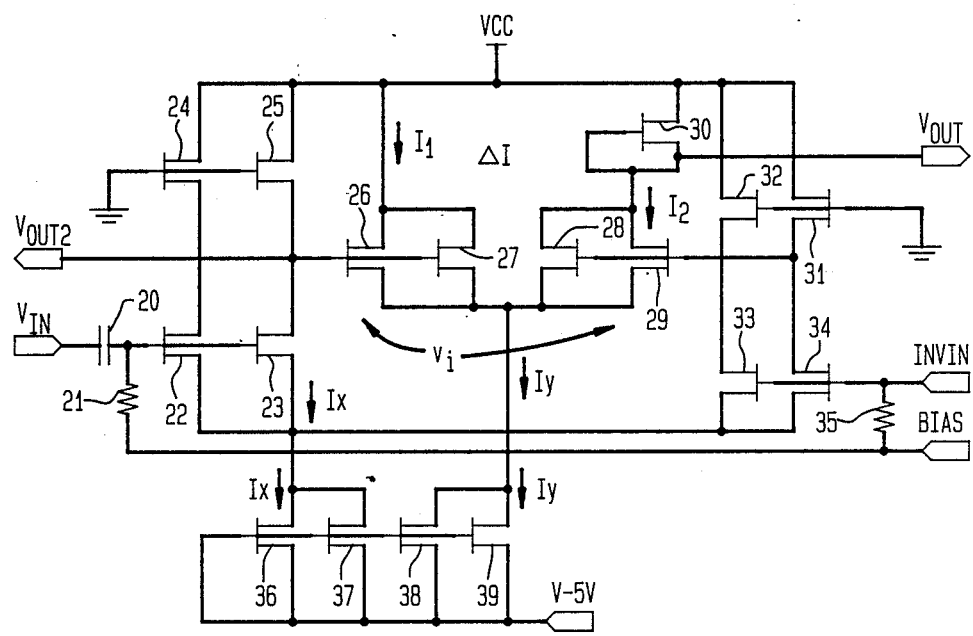
FIG. 3 shows an improved linear amplifier circuit according to the prior art.

Referring to FIG. 3, there is shown a linearization scheme employed in an amplifier which will be described. The circuit of FIG. 3 is comprised of pairs of half-size parts in order to compare with the improved circuit of FIG. 5. As one can ascertain from FIG. 3, the input voltage designated as $V_i$ is applied via capacitor 20 and resistor 21 to gate electrodes of FETS 22 and 23. FETS 22 and 23 form a differential amplifier configuration with FETS 33 and 34. FETS 33 and 34 have applied to the gate electrodes the inverted $V_i$ signal or the $V_i$ signal 180° out of phase. The source electrodes of FETS 22, 23, 33, and 34 are connected together thus forming the differential amplifier. The ground return for the amplifier is provided by means of FETS 36 and 37. Each of these FETS has the gate electrode coupled or connected to the source electrodes to operate in the saturation mode and provide a constant current return path for the differential amplifier configuration of FETS 22, 23, 33, and 34.

The drain electrode of FET 22 is coupled to the source electrode of FET 24 which has a grounded gate electrode. The drain electrode of FET 24 is directed to a source of operating potential designated as VCC. The drain electrode of FET 23 is coupled or connected to the source electrode of FET 25. The drain electrode of FET 25 is also coupled to the +VCC supply. The gate electrode of FET 25 is connected to the gate electrode of FET 24 and is therefore also grounded. The junction between the source electrode of FET 25 and the drain electrode of FET 23 is connected to the gate electrodes of FETS 26 and 27. The source electrodes of FETS 26 and 27 are connected together and to the source electrodes of FETS 28 and 29 to form a second differential amplifier. The return for the second amplifier is via FETS 38 and 39 arranged to operate as a constant current source.

As seen in FIG. 3, the junction between the source electrode of FET 25 and the drain electrode of FET 23 is connected to the gate electrodes of FETS 26 and 27 and is employed as one output designated as VOUT 2. FET 31 has its gate electrode connected to the point of reference potential or ground which is also connected to the gate electrode of FET 32. The drain electrode of FETS 31 and 32 are directed to the +VCC supply. As indicated above, for FETS 22 and 23, the drain electrode of FET 33 is coupled to the source electrode of FET 32, with the drain electrode of FET 34 coupled or connected to the source electrode of FET 31. A further FET 30 has its drain electrode coupled to the +VCC supply and has its source and gate electrodes connected together, whereby the connected gate and source electrode is directed to the connected drain electrodes of FETS 28 and 29. FET 30 serves as a load for the second differential amplifier. The main output designated as VOUT is taken from the common connection between the source and drain electrode of FET 30 and FETS 28 and 29. Biasing may also be applied to the gate electrodes of FETS 22, 23, 33, and 34 via resistors 21 and 35 and by means of a biasing source designated in FIG. 3 by the term BIAS.

As one can ascertain from FIG. 3, the input designated as $V_i$ is generated from the VIN signal which modulates the current $I_x$. The current $I_x$ propagates through FETS 36 and 37 to generate proportional VGS's. Hence, $V_i$ is the difference of VGS 24, 25, and VGS 31, 32. In this way, the output current $\Delta I$ is linearized to give a current according to the following equation:

$$\Delta I = \mu I_x I_y \tag{2}$$

The Factor $\mu$ is the conversion constant. The problem of generating $V_i$ from VIN still remains and is restricted to approximately the same limits as before. In other words, not much advantage can be realized if $I_x = I_y$ in which case a 30 percent modulated $I_x$ successfully (better than 99 percent) sets up an identical $I_y$. $I_y$ is also 30 percent modulated. The advantage however is realized in two ways. (1) By summing $I1$ with the correct phase component of $I_x$ (IDS 31,32) to give an output current of 2×I1 etc. Or (2) By increasing $I_y$ and resizing FETS 26, 27, 28 and 29 such that the current density in FETS 26, 27, 28 and 29 match the current densities in FETS 24, 25, 31 and 32 for maximum linearity, further (1) and (2) together for maximum gain.

What is meant by resizing the FET is that one in MOSFET or MESFET technology can fabricate the FETS with different effective gate widths than other FETS in the circuit. Based on this factor, the FETS having different gate widths have different gain characteristics and therefore can accommodate more or less current according to the respective size of the gate electrodes as compared to the drain and source electrodes.

Figure 4:
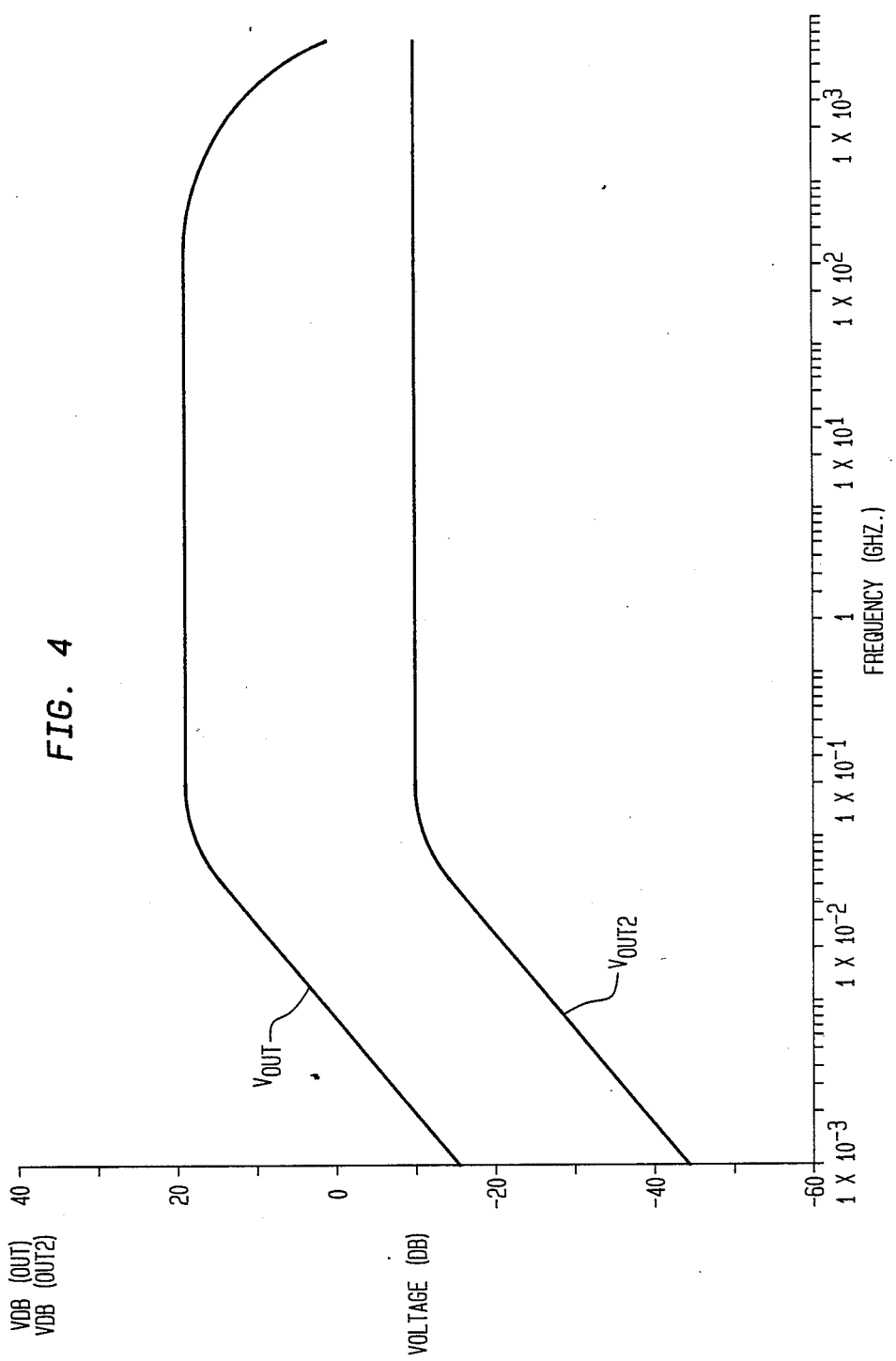
FIG. 4 is a graph depicting the small signal output of the circuit shown in FIG. 3.

Referring to FIG. 4, there is shown the graph of a small signal output of the circuit of FIG. 3. The abscissia represents the frequency range while the ordinate represents voltage in terms of decibels (DB). As one can see, there is shown VOUT 2 and VOUT. It is noted that both voltages are linear for the range from 0.1 to 11 GHZ. The circuit shown in FIG. 3 is basically anticipated by circuit configurations shown by B. Gilbert in the article entitled "New Wide-Band Amplifier Technique" in the *IEEE Journal of Solid State Circuits*, Vol. SC-3 No. 4, December 1968.

Figure 5:
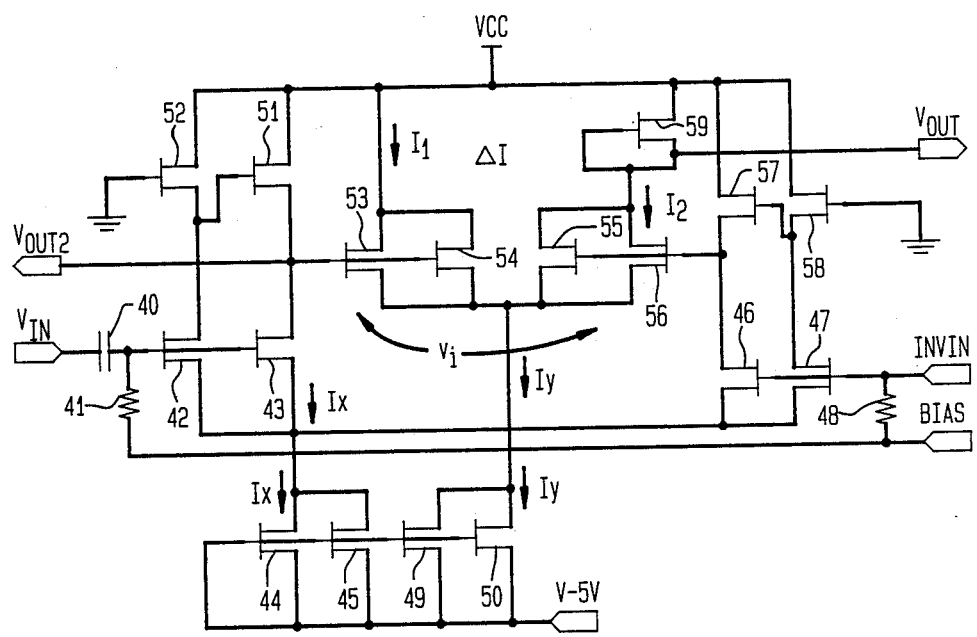
FIG. 5 is a detailed schematic diagram depicting the improved amplifier circuit according to this invention.

Referring to FIG. 5, there is shown a simple and extremely effective improvement in the amplifier circuit by which the current $I_y$ modulation depth can be increased linearly and hence higher gain is realized at the same linearity and without any increase in the effective current $I_y$.

As seen in FIG. 5, the input signal VIN is applied via capacitor 40 and resistor 41 to the connected gate electrodes of FETS 42 and 43. FETS 42 and 43 are arranged in a differential amplifier configuration with FETS 46 and 47. The source electrodes of the FETS 42, 43, 46 and 47 are connected together and returned to ground through a constant current source consisting of FETS 44 and 45 having their gate electrodes connected to their source electrodes and connected to a negative voltage supply or a point of reference potential.

The drain electrode of FET 43 is connected to a terminal designated as VOUT 2 which is connected to the source electrode of FET 51. An FET 52 has its gate electrode grounded whereas transistor 51 has its gate electrode connected to the source electrode of transistor 52. Both drain electrodes of transistors 51 and 52 are directed to the source of operating potential designated as +VCC. The source electrode of FET 52 is connected to the drain of FET 42. The drain electrode of FET 46 is connected to the source electrode of FET 57 which performs the same function as FET 51. The source electrode of FET 57 is coupled to the gate electrodes of FETS 55 and 56 having their drain electrodes connected together and having their source electrodes connected to the source electrodes of FETS 53 and 54. FETS 53 and 54 have the gate electrodes connected to the source electrode of FET 51. The drain electrode of FET 47 is connected to the source electrode of FET 58 which has its gate electrode grounded as indicated. The source electrode of FET 58 is also connected to the gate electrode of FET 57. Both drain electrodes of FETS 57 and 58 are directed to the source of operating potential designated as +VCC.

The FET configurations 53, 54, 55, and 56 form a first differential amplifier having a ground return through FETS 49 and 50 operate as a constant current generator for the current $I_y$. The first pair of FETS 53 and 54 are coupled directly via the drain electrodes to the VCC supply. The second pair of FETS 55 and 56 are coupled to a load FET 59 having its drain coupled to +VCC and capable of accommodating the current I2 as seen in FIG. 5. The difference between the amplifier of FIG. 5 and that of FIG. 3 is the connections of FETS 51 and 52 and FETS 57 and 58 (FIG. 5) as compared to FETS 24 and 25 and FETS 31 and 32 of FIG. 3.

The amplifier shown in FIG. 5 was fabricated employing a pair of half size parts (FETS) as compared to those appearing in FIG. 3. As indicated, the difference in wiring appears in the instances of FETS 51 and 52, 57 and 58 as compared to FETS 24 and 25 and 31 and 32 of FIG. 3. The cascaded FETS 51 and 52 and cascaded FETS 57 and 58 operate to generate a VGS which is two times the VGS as accommodated by the circuit of FIG. 3. Since both VGS 51 and 52 and VGS 57 and 58 are modulated by the signal current (modulated by $I_x$) and that the current density in each device is the same as that in FIG. 3, the $V_i$ or $V_i^1$ 1 in FIG. 5 is effectively two times the $V_i$ of FIG. 3. Hence the overall $V_i$ is given by the equation below:

$$V_i^1 = 2\ (VGS\ 51,52 - VGS\ 57,58) = 2^*V_i \qquad (3)$$

The transfer function is doubled over the circuit of FIG. 3. Another advantage of the amplifier of FIG. 5 is that the overall bandwidth (BW) is not degraded since the multiplication of VGS by 2 is done via a cascaded source follower which has an extremely wide BW.

Figure 6:
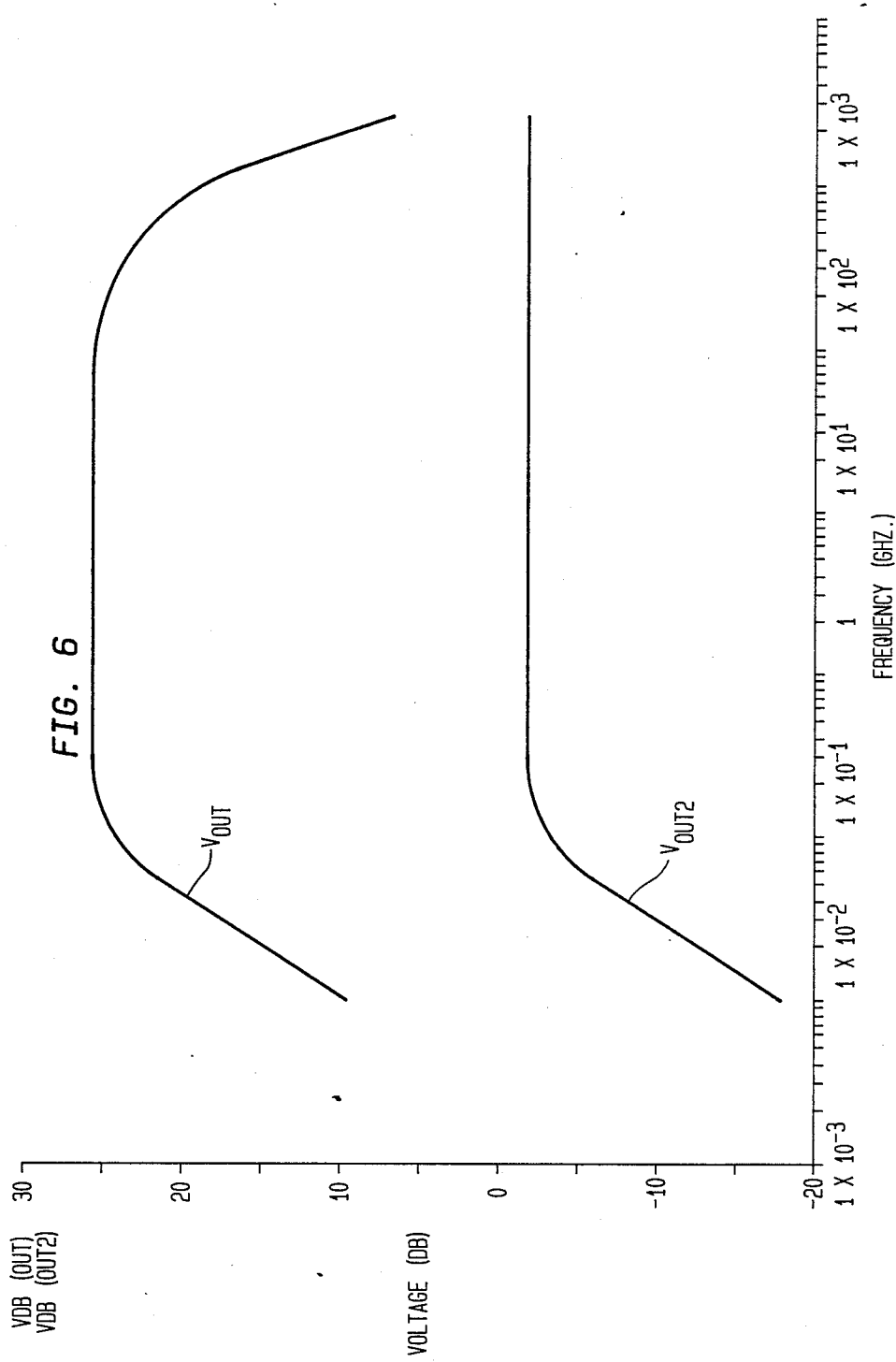
FIG. 6 is a graph depicting the small signal output of the circuit of FIG. 5 showing the improved amplifier response.

Referring to FIG. 6, there is shown a graph of voltage versus frequency for the amplifier configuration shown in FIG. 5 regarding small signal operation.

Figure 7:
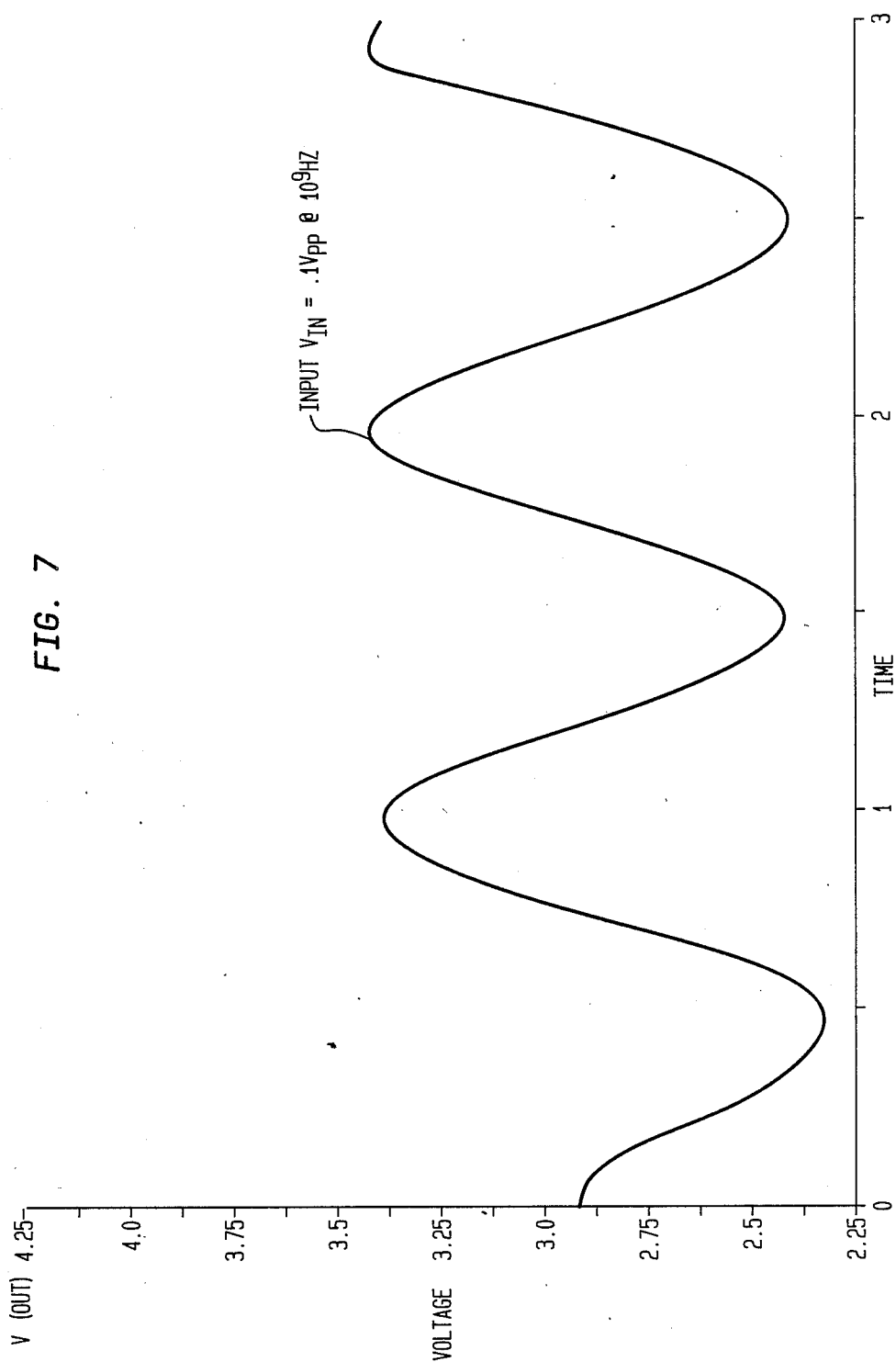
FIG. 7 is a graph depicting the large signal behavior of the circuit of FIG. 4 showing an improved amplifier large-signal output.

FIG. 7 shows the large signal output of the amplifier circuit of FIG. 5 indicating an improved amplifier response. If one compares FIG. 6 with FIG. 4, one will notice that VOUT 2 as shown in FIG. 6 is more linear than that shown in FIG. 3 with the further factor that the gain of the amplifier of FIG. 5 is greater than the gain of the amplifier shown in FIG. 3. It is noted that both VOUT and VOUT 2 of FIG. 6 are in fact of a higher gain and more linear than the VOUT and VOUT 2 of FIG. 4.

There is some degradation of bandwidth in the circuit of FIG. 5 based on the fact that a poorer I/C ratio in the predistortion circuit is present as compared with that of FIG. 3. Also the Miller effect is stronger by way of larger gain and the INVIN port is held at a larger source resistance (2.2K). This degradation is insignificant compared with bandwidth shrinkage observed in cascaded gain stages which is a function of the number of gain stages as for example directly proportional to 1 over the square root of $2^n$; where n equals the number of cascaded stages.

Thus the circuit configuration shown in FIG. 5 is superior to that shown in FIG. 3 and has extremely improved operation due to the fact that the circuit provides a depth of modulation which is increased and hence higher gain is realized with linearity without any increase in current.

Other modifications and improvements should be apparent to those skilled in the art and all of which are deemed to be encompassed within the spirit and scope of the claims appended hereto.

I claim:

1. An improved wideband amplifier apparatus (FIG. 5) for exhibiting increased gain over a broad bandwidth comprising:
    a first pair of FETS (53, 56) arranged in a differential amplifier configuration having source electrodes coupled together, and drain electrodes adapted to be coupled to a point of operating potential (vCC), and means (49, 50) coupled to said source electrodes of said first pair to provide a current return for said first pair, each FET in said first pair having a gate electrode, a second pair of FETS (42, 43) having gate electrodes coupled together for receiving an input signal and source electrodes coupled together, with a first FET (42) in said second pair having a drain electrode coupled to the source electrode of a third FET (52) with the gate electrode of said third FET (52) coupled to a point of reference potential and with the drain electrode of said third FET (52) adapted to be coupled to said point of operating potential, with the drain electrode of a second FET (43) in said second pair coupled to the source electrode of a fourth FET (51) at a first junction, with the source electrode of said third FET (52) coupled to the gate electrode of said fourth FET (51) and with said first junction coupled to the gate electrode of a first FET (53) in said first pair, said first junction providing an output (VOUT 2), a third pair of FETS (46, 47) having gate electrodes coupled together for receiving said input signal and source electrodes of said second pair of FETS (42,43) to form a differential amplifier configuration therewith and means (44, 45) coupled to said source electrodes of said second and third pairs to provide a current return for said second and third pairs, and with the drain electrode of a first FET (47) in said third pair coupled to the source electrode of a fifth FET (58) at a second junction, with the gate electrode of said fifth FET (58) coupled to a point of reference potential, and with the drain electrode of a second FET (46) in said third pair coupled to the source electrode of a sixth FET (57) at a third junction, the gate electrode of said sixth FET (57) being coupled to the second junction, with the drain electrodes of said fourth, fifth and sixth FETS (51, 57, 58) adapted to be coupled to said point of operating potential and with the third junction coupled to the gate electrode of a second FET (56) in said first pair, whereby upon receipt of said input signal, said amplifier provides a high gain output signal at the drain electrode of said second FET (43) of said second pair (VOUT 2).

2. The improved wideband amplifier according to claim 1, wherein said means (49, 50) to coupled said source electrodes of said first pair of FETS (53, 56) is a constant current source.

3. The improved wideband amplifier according to claim 2, wherein said constant current source includes a seventh FET (50) having a drain electrode coupled to the source electrodes of said first FET pair (53, 56) and having the source electrode connected to the gate electrode and to a point of reference potential.

4. The improved wideband amplifier according to claim 3, further including a eighth FET (49) in shunt with said seventh FET (50).

5. The improved wideband amplifier according to claim 1, wherein said means (44, 45) coupled to said source electrodes of said second and third pairs (42, 43, 46, 47) is a constant current source.

6. The improved wideband amplifier according to claim 5, wherein said constant current source includes a seventh FET (44) having a drain electrode coupled to the source electrodes of said second and third pairs (42, 43, 46, 47) and having the source electrode connected to the gate electrode and to a point of reference potential.

7. The improved wideband amplifier according to claim 6, further including an eighth FET (45) in shunt with said seventh FET (44).

8. The improved wideband amplifier according to claim 1, further including,
a fourth pair of FETS (54, 55) with a first FET (55) of said fourth pair in shunt with said first FET (53) of said first pair and with a second FET (55) of said fourth pair in shunt with said second FET (56) of said first pair, as having the gate, source and drain electrodes connected together.

9. The improved wideband amplifier according to claim 1, further including,
a seventh FET (59) having the gate electrode connected to the source electrode and connected to the drain electrode of said second FET (56) in said first pair and having the drain of said seventh FET adapted to be connected to said point of operating potential (VCC) to form a load for said second FET (56) to provide another output (VOUT) for said amplifier.

10. The improved wideband amplifier according to claim 1, further including a capacitor (40) having one terminal coupled to the gate electrode of said first FET (42) in said second pair and the other terminal adapted to receive an input signal.

11. The improved wideband amplifier according to claim 10, further including means (48) coupled to the gate electrode of said first FET (47) of said third pair for applying an inverted input signal thereto.

12. The improved wideband amplifier according to claim 10, further including a resistor (41) having one terminal coupled to the gate electrode of said first FET (42) of said second pair and a second terminal adapted to receive a biasing potential (BIAS).

13. The improved wideband amplifier according to claim 12, further including a resistor (48) having one terminal coupled to the gate electrode of said first FET (47) of said third pair and a second terminal adapted to receive said biasing potential.

14. The improved wideband amplifier according to claim 1, wherein all of said FETS are MOSFETS capable of being fabricated as an MMIC.

15. The improved wideband amplifier according to claim 1, wherein all of said FETS are MESFETS capable of being fabricated as an MMIC.

16. In a wideband amplifier (FIG. 3) employing a first pair of FETS (26, 29) arranged in a differential amplifier configuration and having the source electrodes coupled together and returned to a point of reference potential via a first constant current source (38, 39) with the drain electrodes coupled to a point-of operating potential (VCC), a second pair of FETS (22, 23) arranged in a differential amplifier configuration having the source electrodes connected together and returned to a point of reference potential via a second constant current source (36, 37), a third pair of FETS (33, 34) arranged in a differential amplifier configuration with the source electrodes coupled together and connected to the source electrodes of said second pair (22, 23) and with the gate electrodes of said second pair connected together for receiving an input signal to be amplified (VIN) and with the gate electrodes of said third pair connected together for receiving said input signal, with the drain electrode of a first FET (22) in said second pair connected to the source electrode of a third FET

(24) having a grounded gate electrode and having a drian electrode adapted to be connected to said point of operating potential (VCC), with the drain electrode of a second FET (23) in said second pair connected to the source electrode of a fourth FET (25) having a drain electrode adapted to be coupled to said point of operating potential (VCC), with the drain electrode of said second FET (23) in said second pair and the source of said fourth FET (25) connected to the gate electrode of a first FET (26) of said first pair, with the drain electrode of a first FET (34) of said third pair connected to the source electrode of a fifth FET (31) having a grounded gate and having a drain adapted to be connected to said point of operating potential (VCC), with the drain electrode of a second FET (33) of said third pair connected to the source electrode of a sixth FET (32) having a drain electrode adapted to be connected to said point of operating potential, with the junction between the source electrode of said sixth FET (32) and the drain of said second FET (33) of said third pair connected to the gate electrode of a second FET (29) of said first pair, the improvement therewith comprising:

means connecting the gate electrode of said fourth FET (25) to the source electrode of said third FET (24), and means connecting the gate electrode of said sixth FET (32) to the source electrode of said fifth FET (31) to generate a gate to source voltage, a VGS, for third and fourth FETS 24 and 25, and fifth and sixth FETS 31 and 32, respectively, which is at least two times that of an amplifier having the gate electrodes of said third and fourth FETS 24 and 25 connected together and the gate electrodes of said fifth and sixth FETS 31 and 32 connected together, whereby a transfer is doubled.

17. The wideband amplifier improvement according to claim 16, wherein said FETS are MOSFETS.

18. The wideband amplifier according to claim 16, wherein said FETS are MESFETS.

19. The wideband amplifier according to claim 16, wherein said first constant current source includes at least one FET (38, 39) arranged having the source to drain path connected between said point of reference potential and the connected source electrodes of said first pair of FETS (26,29).

20. The wideband amplifier according to claim 16, wherein said second constant current source includes at least one FET (36, 37) arranged having the source to drain path connected between said point of reference potential and the connected source electrodes of said second pair of FETS (22,23).

* * * * *